United States Patent
Tsuchiya et al.

(10) Patent No.: US 9,681,078 B2
(45) Date of Patent: Jun. 13, 2017

(54) SOLID-STATE IMAGE SENSOR

(71) Applicant: CANON KABUSHIKI KAISHA, Tokyo (JP)

(72) Inventors: Masayuki Tsuchiya, Ebina (JP); Kouhei Hashimoto, Oita (JP); Yasushi Nakata, Yokohama (JP); Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/007,579

(22) Filed: Jan. 27, 2016

(65) Prior Publication Data
US 2016/0234409 A1    Aug. 11, 2016

(30) Foreign Application Priority Data

Feb. 5, 2015   (JP) ................................. 2015-021489

(51) Int. Cl.
*H04N 5/335*   (2011.01)
*H01L 27/148*   (2006.01)
(Continued)

(52) U.S. Cl.
CPC ......... *H04N 5/372* (2013.01); *H01L 27/1461* (2013.01); *H01L 27/1463* (2013.01);
(Continued)

(58) Field of Classification Search
CPC ...... H04N 5/2253; H04N 5/372; H04N 5/374; H01L 27/1461; H01L 27/14614; H01L 27/14643
USPC ...... 358/513, 482, 514; 250/208.1; 348/308, 348/294; 257/222, 223, 225–234, 257, 257/258, 292, 294, 431–448
See application file for complete search history.

(56) References Cited

U.S. PATENT DOCUMENTS 7,323,731 B2   1/2008   Yuzurihara et al.
7,473,948 B2   1/2009   Yuzurihara et al.
(Continued)

FOREIGN PATENT DOCUMENTS

JP    2010-245567 A    10/2010

OTHER PUBLICATIONS

U.S. Appl. No. 14/996,774, filed Jan. 15, 2016, Taro Kato, et al.

*Primary Examiner* — Xi Wang
(74) *Attorney, Agent, or Firm* — Fitzpatrick, Cella, Harper & Scinto

(57) ABSTRACT

An image sensor includes charge accumulation region of first conductivity type, floating diffusion of the first conductivity type, stacked semiconductor region having first region of second conductivity type arranged below the charge accumulation region, second region of the second conductivity type arranged above the first region, and third region of the second conductivity type arranged above the second region. The sensor further includes fourth region of the second conductivity type arranged in region between the charge accumulation region and the floating diffusion, below the floating diffusion, and above the stacked semiconductor region, transfer gate for transferring charges of the charge accumulation region to the floating diffusion, and fifth region of the second conductivity type arranged in region below the charge accumulation region and the fourth region, and above the stacked semiconductor region.

13 Claims, 7 Drawing Sheets

(51) Int. Cl.
  *H01L 27/00* (2006.01)
  *H04N 5/372* (2011.01)
  *H01L 27/146* (2006.01)

(52) U.S. Cl.
  CPC .. *H01L 27/14612* (2013.01); *H01L 27/14643* (2013.01); *H01L 27/14689* (2013.01)

(56) References Cited

U.S. PATENT DOCUMENTS

| | | |
|---|---|---|
| 7,679,116 B2 | 3/2010 | Yuzurihara et al. |
| 7,928,486 B2 | 4/2011 | Yuzurihara et al. |
| 7,935,995 B2 * | 5/2011 | Watanabe ......... H01L 27/14603 257/292 |
| 7,993,951 B2 | 8/2011 | Okabe et al. |
| 8,222,682 B2 | 7/2012 | Watanabe et al. |
| 8,293,559 B2 | 10/2012 | Okabe et al. |
| 8,349,640 B2 | 1/2013 | Soda |
| 8,866,205 B2 | 10/2014 | Nakata et al. |
| 8,976,282 B2 | 3/2015 | Soda |
| 9,026,972 B2 | 5/2015 | Soda |
| 9,094,624 B2 | 7/2015 | Shimotsusa et al. |
| 9,136,407 B2 | 9/2015 | Tsuchiya |
| 9,257,472 B2 | 2/2016 | Soda |
| 2002/0118291 A1 * | 8/2002 | Ishigami ............ H04N 3/1537 348/311 |
| 2007/0075337 A1 * | 4/2007 | Jung, II ............ H01L 27/14603 257/215 |
| 2011/0163407 A1 | 7/2011 | Yuzurihara et al. |
| 2012/0188400 A1 * | 7/2012 | Smith ............... H01L 27/14621 348/223.1 |
| 2014/0111663 A1 | 4/2014 | Soda |
| 2014/0307151 A1 | 10/2014 | Soda |
| 2015/0123180 A1 * | 5/2015 | Sato ..................... H04N 5/363 257/292 |
| 2015/0145089 A1 | 5/2015 | Soda |
| 2015/0214268 A1 * | 7/2015 | Kim .................. H01L 27/14645 257/432 |

\* cited by examiner

SOLID-STATE IMAGE SENSOR

BACKGROUND OF THE INVENTION

Field of the Invention

The present invention relates to a solid-state image sensor and a camera.

Description of the Related Art

Japanese Patent Laid-Open No. 2010-245567 discloses a CMOS area sensor including a photodiode unit and a transfer MOS transistor unit. The photodiode unit is formed by a surface p-type impurity semiconductor region, an n-type impurity semiconductor region (charge accumulation region) arranged below the surface p-type impurity semiconductor region, and a p-type well arranged at least below the n-type impurity semiconductor region. The p-type well is formed by stacking a plurality of p-type impurity semiconductor regions. The p-type well is arranged so as to expand to, in addition to a region below the n-type impurity semiconductor region (charge accumulation region), a region below a transfer MOS transistor and a floating diffusion.

Generally speaking, in a solid-state image sensor, the gate length of a transfer transistor and the distance between the charge accumulation region and the floating diffusion become smaller along with a reduction in a pixel size. If the distance between the charge accumulation region and the floating diffusion becomes smaller, charges are likely to leak from the charge accumulation region to the floating diffusion. This may bring about, for example, a drop in the number of saturated charges.

SUMMARY OF THE INVENTION

The present invention provides a solid-state image sensor having a structure advantageous in reducing a pixel size.

One of aspects of the present invention provides a solid-state image sensor comprising: a charge accumulation region of a first conductivity type; a floating diffusion of the first conductivity type; a stacked semiconductor region which includes a first semiconductor region of a second conductivity type different from the first conductivity type arranged below the charge accumulation region, a second semiconductor region of the second conductivity type arranged above the first semiconductor region, and a third semiconductor region of the second conductivity type arranged above the second semiconductor region; a fourth semiconductor region of the second conductivity type arranged in a region between the charge accumulation region and the floating diffusion, below the floating diffusion, and above the stacked semiconductor region; a transfer gate configured to form a channel, in the fourth semiconductor region, for transferring charges of the charge accumulation region to the floating diffusion; and a fifth semiconductor region of the second conductivity type arranged in a region below the charge accumulation region and the fourth semiconductor region, and above the stacked semiconductor region, wherein letting C1 be a peak value of an impurity concentration of the second conductivity type in the first semiconductor region, C2 be a peak value of an impurity concentration of the second conductivity type in the second semiconductor region, C3 be a peak value of an impurity concentration of the second conductivity type in the third semiconductor region, and C5 be a peak value of an impurity concentration of the second conductivity type in the fifth semiconductor region, $C2 < C3 < C1$ and $C5 < C3$ are satisfied.

Further features of the present invention will become apparent from the following description of exemplary embodiments (with reference to the attached drawings).

DESCRIPTION OF THE EMBODIMENTS

An exemplary embodiment of the present invention will be described below with reference to the accompanying drawings.

Figure 8:
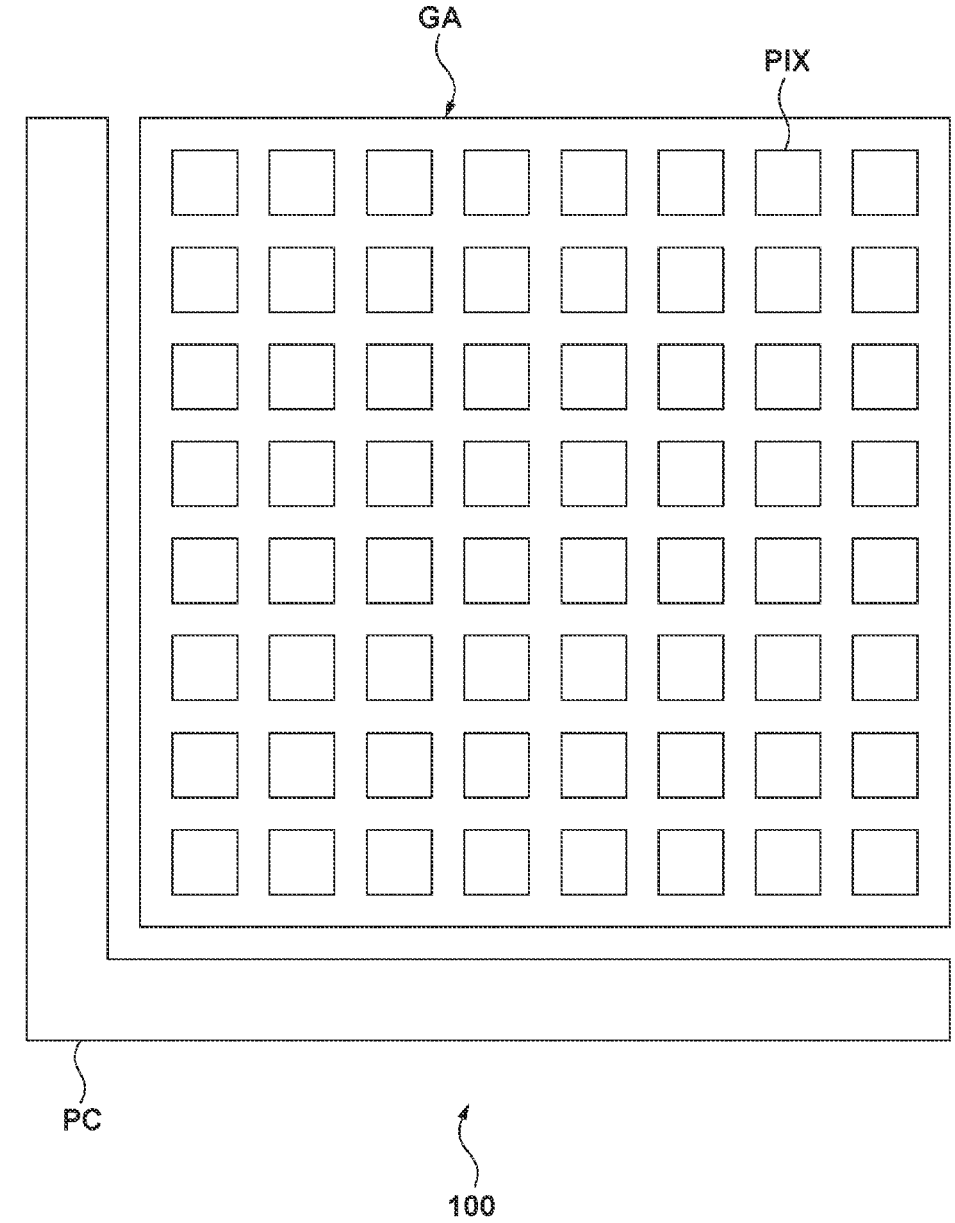
FIG. 8 is a view showing the arrangement of the solid-state image sensor according to one embodiment of the present invention.

FIG. 8 shows the arrangement of a solid-state image sensor 100 according to one embodiment of the present invention. The solid-state image sensor 100 includes a pixel array GA in which a plurality of pixels PIX are arrayed so as to form a plurality of rows and a plurality of columns, and a peripheral circuit PC which drives the pixel array GA to read out a signal of each pixel PIX from the pixel array GA. The solid-state image sensor 100 can be formed as, for example, an MOS image sensor, a CCD image sensor, or an image sensor of another form.

Figure 1:
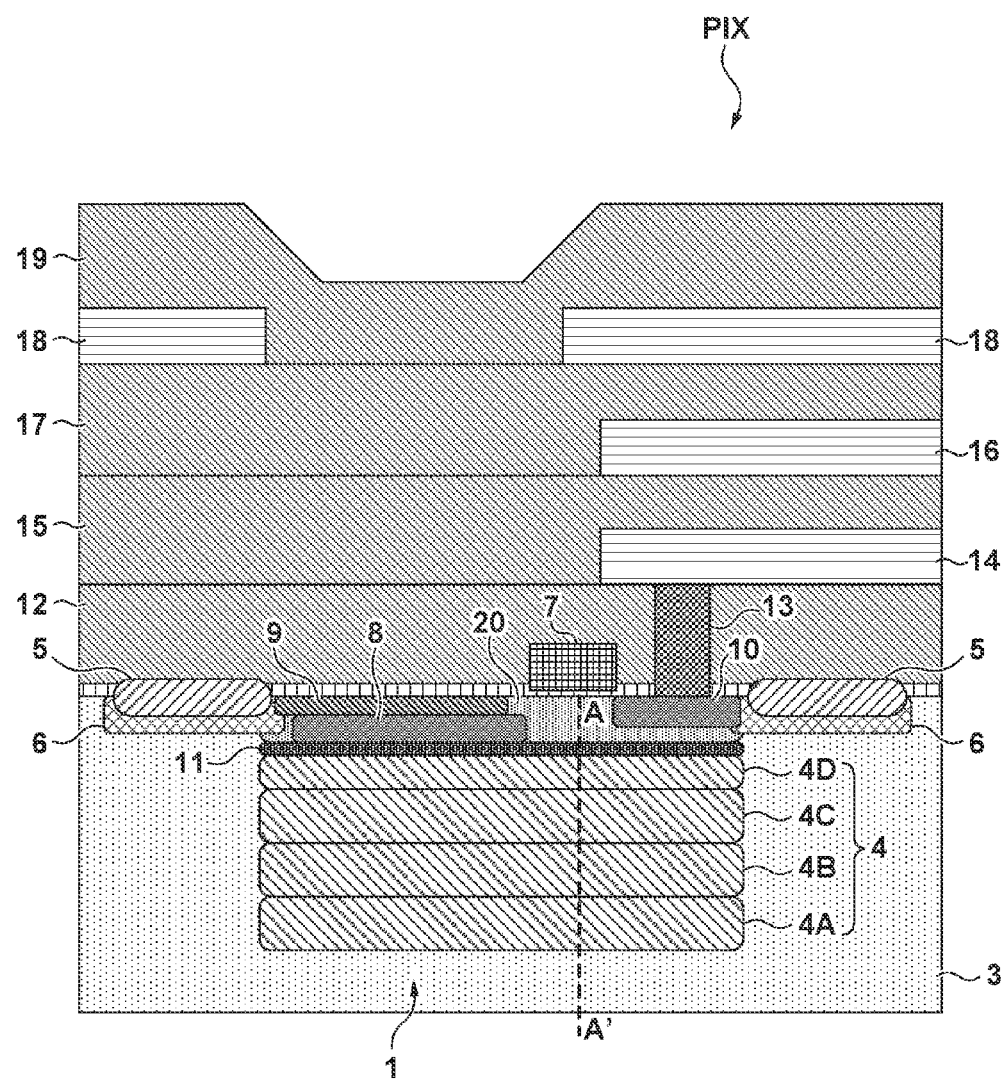
FIG. 1 is a view schematically showing the sectional structure of one pixel of a pixel array according to the first embodiment of the present invention.

FIG. 1 schematically shows the sectional structure of one pixel PIX in the pixel array GA according to the first embodiment of the present invention. The solid-state image sensor 100, the pixel array GA, or each pixel PIX can include a charge accumulation region 8, a surface region 9, a floating diffusion (to be referred to as an FD hereinafter) 10, a fourth semiconductor region 20, a stacked semiconductor region 4, a fifth semiconductor region 11, and a transfer gate 7. In addition, the solid-state image sensor 100, the pixel array GA, or each pixel PIX can include an element isolation portion 5, a channel stopper 6, insulation films 12, 15, 17, and 19, wiring patterns 14, 16, and 18, a contact plug 13, and the like. The insulation films 12, 15, and 17 can be interlayer insulation layers. The insulation film 19 can be a passivation film. The solid-state image sensor 100, the pixel array GA, or each pixel PIX can further include a color filter and/or a microlens.

In a description below, the terms "the first conductivity type and the second conductivity type" are used to distinguish conductivity types. The first conductivity type and the second conductivity type are different from each other. If the first conductivity type is an n type, the second conductivity type is a p type. If the first conductivity type is the p type, the second conductivity type is the n type.

The charge accumulation region 8 is formed by a semiconductor region of the first conductivity type. If the first conductivity type is the n type, electrons out of the electrons and holes generated by photoelectric conversion are accumulated in the charge accumulation region. If the first conductivity type is the p type, the holes out of the electrons and the holes generated by photoelectric conversion are accumulated in the charge accumulation region 8. The surface region 9 is formed by a semiconductor region of the second conductivity type. In this example, the charge accumulation region 8, the surface region 9, and the stacked semiconductor region 4 constitute a photodiode 1 as a photoelectric conversion element. Note that the surface region 9 need not be provided. However, a noise component caused by a dark current can be reduced by providing the surface region 9.

The FD 10 is formed by a semiconductor region of the first conductivity type. A fourth semiconductor region 20 is formed by a semiconductor region of the second conductivity type. The fourth semiconductor region 20 is arranged in a region between the charge accumulation region 8 and the FD 10, below the FD 10, and above the stacked semiconductor region 4.

The charge accumulation region 8, the stacked semiconductor region 4, the FD 10, the fourth semiconductor region 20, the fifth semiconductor region 11, and the channel stopper 6 are formed in a semiconductor substrate 3. The semiconductor substrate 3 is, for example, a semiconductor substrate of the first conductivity type. However, it may be a semiconductor substrate of the second conductivity type. The semiconductor substrate 3 may be a surface layer (for example, an epitaxial growth layer) of the semiconductor substrate.

The transfer gate 7 forms a channel for transferring charges accumulated in the charge accumulation region 8 of the first conductivity type to the FD 10 of the first conductivity type in the fourth semiconductor region 20 of the second conductivity type. The transfer gate 7 is a gate electrode. The charge accumulation region 8, the FD 10, the fourth semiconductor region 20, and the transfer gate 7 have an MOS transistor structure. Note that one of the charge accumulation region 8 and the FD 10 corresponds to a source, and the other corresponds to a drain.

The fifth semiconductor region 11 is formed by an impurity semiconductor region of the second conductivity type. The fifth semiconductor region 11 of the second conductivity type is arranged in a region below the charge accumulation region 8 of the first conductivity type and the fourth semiconductor region 20 of the second conductivity type, and above the stacked semiconductor region 4 of the second conductivity type. The fifth semiconductor region 11 can function as a punch-through stopper which prevents occurrence of punch through between the charge accumulation region 8 and the FD 10. More specifically, the fifth semiconductor region 11 prevents a depletion layer extending from the charge accumulation region 8 and a depletion layer extending from the FD 10 from connecting to each other. That is, the fifth semiconductor region 11 prevents charge leakage from the charge accumulation region 8 to the FD 10. This makes it possible to increase the number of charges that can be accumulated in the charge accumulation region 8, that is, the number of saturated charges. Note that the fifth semiconductor region 11 at least suffices to be below the charge accumulation region 8 and the fourth semiconductor region 20, and need not extend below the FD 10.

The stacked semiconductor region 4 includes a first semiconductor region 4A of the second conductivity type, second semiconductor regions 4B and 4C of the second conductivity type arranged above the first semiconductor region 4A, and a third semiconductor region 4D of the second conductivity type arranged above the second semiconductor regions 4B and 4C. In this example, the two semiconductor regions 4B and 4C are arranged between the first semiconductor region 4A and the third semiconductor region 4D. However, one of the second semiconductor regions 4B and 4C can be removed. In addition to the second semiconductor regions 4B and 4C, another second semiconductor region may be arranged between the first semiconductor region 4A and the third semiconductor region 4D. Each of the first semiconductor region 4A, the second semiconductor regions 4B and 4C, and the third semiconductor region 4D has its peak in an impurity concentration distribution in the depth direction of the semiconductor substrate 3.

Figure 2:
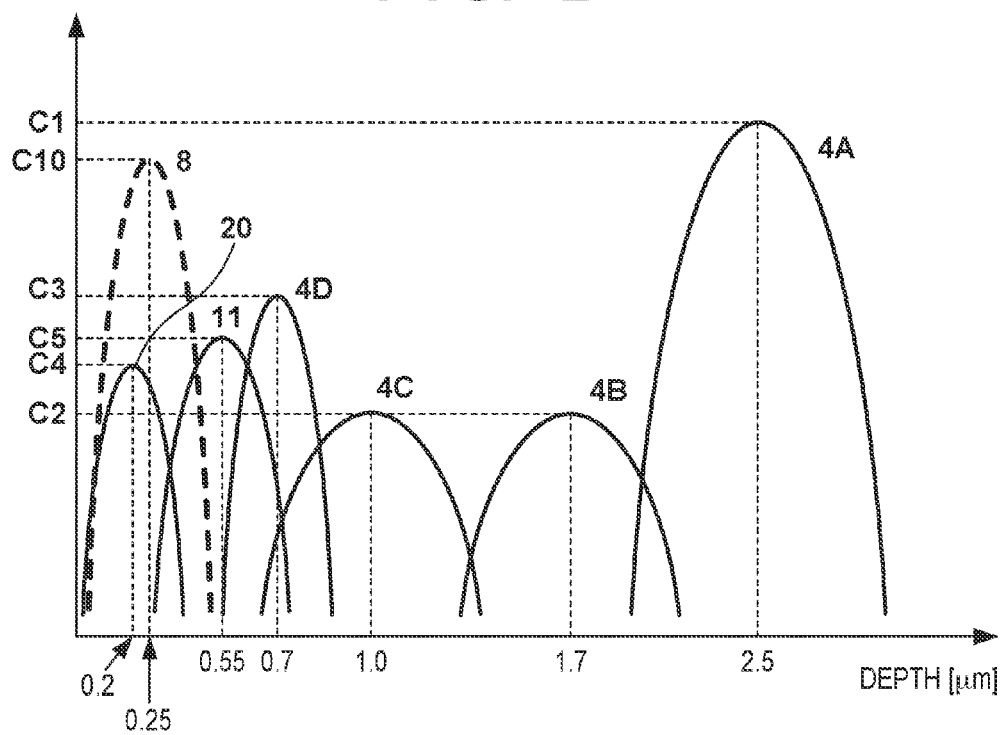
FIG. 2 is a graph exemplifying an impurity concentration distribution in the depth direction (a line A-A' in FIG. 1) of a semiconductor substrate.

FIG. 2 shows an example of the impurity concentration distribution in the depth direction (a line A-A' in FIG. 1) of the semiconductor substrate 3. In FIGS. 3, 4A, 4B, 4C, 4D, 11, 20, and 8 denote impurity concentrations (the distribution thereof) of the first semiconductor region 4A, the second semiconductor regions 4B and 4C, the third semiconductor region 4D, the fifth semiconductor region 11, the fourth semiconductor region 20, and the charge accumulation region 8. Note that each of 4A, 4B, 4C, 4D, 11, and 20 indicated by a solid line denotes the impurity concentration of the second conductivity type, and 8 indicated by a dotted line denotes the impurity concentration distribution of the first conductivity type.

Let C1 be a peak value of the impurity concentration of the second conductivity type in the first semiconductor region 4A, C2 be a peak value of the impurity concentration of the second conductivity type in each of the second semiconductor regions 4B and 4C, and C3 be a peak value of the impurity concentration of the second conductivity type in the third semiconductor region 4D. Further, let C5 be a peak value of the impurity concentration of the second conductivity type in the fifth semiconductor region 11 and C4 be a peak value of the impurity concentrations of the second conductivity type in the fourth semiconductor region 20. Furthermore, let C10 be a peak value of the impurity concentration of the first conductivity type in the charge accumulation region 8.

The peak of the impurity concentration of the second conductivity type in the first semiconductor region 4A forms a potential peak which defines spectral sensitivity. The peak of the impurity concentration of the second conductivity type in the first semiconductor region 4A forms a potential barrier which restricts charge movement in the depth direction of the semiconductor substrate 3. This potential barrier prevents the charges out of the positive and negative charges (the holes and the electrons) generated by photoelectric conversion that should be accumulated in the charge accumulation region 8 from being lost in the depth direction of the semiconductor substrate 3.

Each of the second semiconductor regions 4B and 4C, and the first semiconductor region 4A functions as a path which causes light to reach the first semiconductor region 4A. Each of the second semiconductor regions 4B and 4C, and the first semiconductor region 4A also functions as a path which moves, to the charge accumulation region 8, the charges out of the positive and negative charges (the holes and the electrons) generated by photoelectric conversion that should be accumulated in the charge accumulation region 8.

In order to implement the above-described functions, the condition of C2<C3<C1 should be satisfied. In addition to this condition, the condition of 3×C2≤C1 is preferably satisfied and the condition of 5×C2≤C1 is more preferably satisfied.

Figure 3:
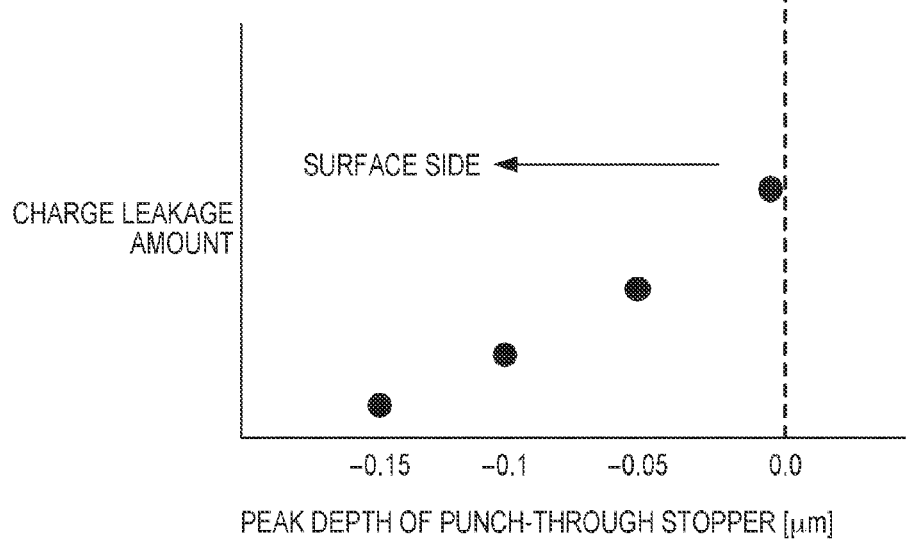
FIG. 3 is a graph exemplifying the relationship between the depth of a punch-through stopper (abscissa) and a charge leakage amount from a charge accumulation region to a floating diffusion (ordinate)

FIG. 3 exemplifies the relationship between the depth of the fifth semiconductor region 11 that can function as the punch-through stopper (abscissa) and a charge leakage amount from the charge accumulation region 8 to the FD 10 (ordinate). The small leakage amount means that the fifth semiconductor region 11 functions as the excellent punch-through stopper. 0.0 [μm] of the abscissa indicates a position in the peak depth direction of the impurity concentration of the second conductivity type in the third semiconductor region 4D positioned in the uppermost portion of the stacked semiconductor region 4. The abscissa indicates the depth direction as the + direction and the shallow direction as the − direction.

As exemplified in FIG. 2, it is possible to reduce charge leakage by moving the peak position (depth) of the impurity concentration of the second conductivity type in the fifth semiconductor region 11 from the peak of the impurity concentration of the second conductivity type in the third semiconductor region 4D to the surface side of the semiconductor substrate 3. On the other hand, if the fifth semiconductor region 11 of the second conductivity type is arranged at a shallow position, the lower end of the charge accumulation region 8 of the first conductivity type arranged above the fifth semiconductor region 11 is pushed up, decreasing the number of saturated charges. While increasing the impurity concentration of the fifth semiconductor region 11 of the second conductivity type is advantageous in reducing charge leakage from the charge accumulation region 8 to the FD 10, it causes a drop in the number of saturated charges.

Therefore, the position and the impurity concentration of the fifth semiconductor region 11 which functions as the punch-through stopper should be determined in consideration of the required function as the punch-through stopper and the number of saturated charges. As an example, the fifth semiconductor region 11 is preferably arranged below the charge accumulation region 8 and the fourth semiconductor region 20 of the second conductivity type, and above the stacked semiconductor region 4. Note that the fourth semiconductor region 20 is arranged between the charge accumulation region 8 and the FD 10, and below the FD 10. Alternatively, the fifth semiconductor region 11 is preferably arranged such that a depth indicating the impurity concentration peak of the fifth semiconductor region 11 is positioned between a depth indicating the impurity concentration peak of the fourth semiconductor region 20 and a depth indicating the impurity concentration peak of the third semiconductor region 4D.

From the viewpoint of implementing the practical number of saturated charges, the impurity concentration of the fifth semiconductor region 11 preferably satisfies C5<C3. On the other hand, in order to reduce charge leakage from the charge accumulation region 8 to the FD 10, the fifth semiconductor region 11 should have the peak from which its impurity concentration distribution can be identified and it is further preferable to satisfy C3/4≤C5. Note that as described above, C3 is the peak value of the impurity concentration of the second conductivity type in the third semiconductor region 4D and C5 is the peak value of the impurity concentration of the second conductivity type in the fifth semiconductor region 11.

Moreover, in terms of characteristics of charge transfer in the MOS transistor structure including the transfer gate 7, it is preferable to satisfy C5≥C4 and/or C3>C4, and/or C4<C1. It is possible, by decreasing the impurity concentration of the fourth semiconductor region, to reduce a decrease in transfer efficiency that can be caused by providing the fifth semiconductor region 11. Note that as described above, C4 is the peak value of the impurity concentration of the second conductivity type in the fourth semiconductor region 20.

The preferable ranges of C1, C2, C3, C4, and C5 will exemplarily be described below. However, the present invention is not limited to these ranges. C1, C2, C3, C4, and C5 preferably satisfy the above-described concentration conditions of C2<C3<C1, C5<C3, and the like.

It is preferable that the peak value C1 of the impurity concentration of the second conductivity type in the first semiconductor region 4A falls within the range of $1\times10^{16}$ cm$^{-3}$≤C1≤$1\times10^{18}$ cm$^{3}$ and the depth indicating the peak value C1 falls within the depth range of 2.0 μm to 4.0 μm from the surface of the semiconductor substrate 3. As an example, C1 is $1\times10^{17}$ cm$^{-3}$.

It is preferable that the peak value C2 of the impurity concentration of the second conductivity type in the second semiconductor region 4B falls within the range of $1\times10^{15}$ cm$^{-3}$≤C2≤$5\times10^{16}$ cm$^{-3}$ and the depth indicating the peak value C2 falls within the depth range of 1.2 μm to 2.5 μm from the surface of the semiconductor substrate 3. As an example, C2 is $5\times10^{15}$ cm$^{-3}$.

It is preferable that the peak value C2 of the impurity concentration of the second conductivity type in the second semiconductor region 4C falls within the range of $1\times10^{15}$ cm$^{-3}$≤C2≤$5\times10^{16}$ cm$^{-3}$ and the depth indicating the peak value C2 falls within the depth range of 0.8 μm to 1.5 μm from the surface of the semiconductor substrate 3.

It is preferable that the peak value C3 of the impurity concentration of the second conductivity type in the third semiconductor region 4D falls within the range of $2\times10^{15}$ cm$^{-3}$≤C3≤$2\times10^{17}$ cm$^{-3}$ and the depth indicating the peak value C3 falls within the depth range of 0.5 μm to 1.0 μm from the surface of the semiconductor substrate 3. As an example, C3 is $3\times10^{16}$ cm$^{-3}$.

It is preferable that the peak value C5 of the impurity concentration of the second conductivity type in the fifth semiconductor region 11 falls within the range of $5\times10^{14}$ cm$^{-3}$≤C5≤$2\times10^{17}$ cm$^{-3}$ and the depth indicating the peak value C5 falls within the depth range of 0.3 μm to 0.9 μm from the surface of the semiconductor substrate 3. As an example, C5 is $2.5\times10^{16}$ cm$^{-3}$.

The peak value C4 of the impurity concentration of the second conductivity type in the fourth semiconductor region 20 can be, for example, $1\times10^{14}$ cm$^{3}$≤C4≤$5\times10^{16}$ cm$^{-3}$. The peak value C10 of the impurity concentration of the first conductivity type in the charge accumulation region 8 can be, for example, $2\times10^{16}$ cm$^{-3}$.

It is preferable that the peak value of the impurity concentration of the second conductivity type in the surface region 9 falls within the range of $5\times10^{19}$ cm$^{-3}$ to $5\times10^{20}$ cm$^{-3}$. The peak value of the impurity concentration of the second conductivity type in the surface region 9 is typically larger than the peak value of the impurity concentration of the first conductivity type in the surface region 9.

As described above, according to the first embodiment, it is possible, by providing the fifth semiconductor region 11 that can function as the punch-through stopper, to reduce charge leakage from the charge accumulation region 8 to the FD even if a pixel size is reduced.

Figure 4:
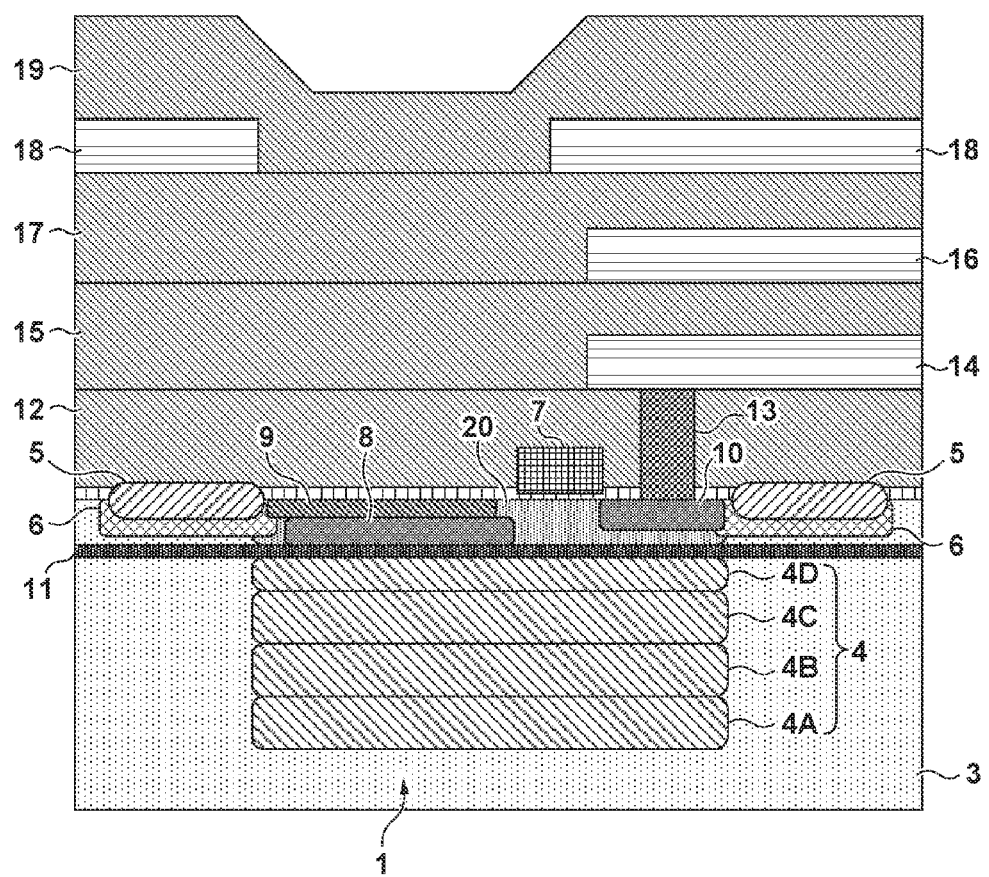
FIG. 4 is a view schematically showing the sectional structure of one pixel of a pixel array according to the second embodiment of the present invention.

FIG. 4 schematically shows the sectional structure of one pixel PIX of a pixel array GA according to the second embodiment of the present invention. The second embodiment is different from the first embodiment in that a fifth semiconductor region 11 that can function as a punch-through stopper includes a part arranged below an element isolation portion 5 arranged adjacent to an FD 10. The second embodiment is the same as the first embodiment in other aspects. In the second embodiment, it is possible to eliminate an influence of an alignment shift caused when forming a resist pattern for forming the fifth semiconductor region 11. It is also possible to further suppress signal charge movement under the element isolation portion 5.

Figure 5:
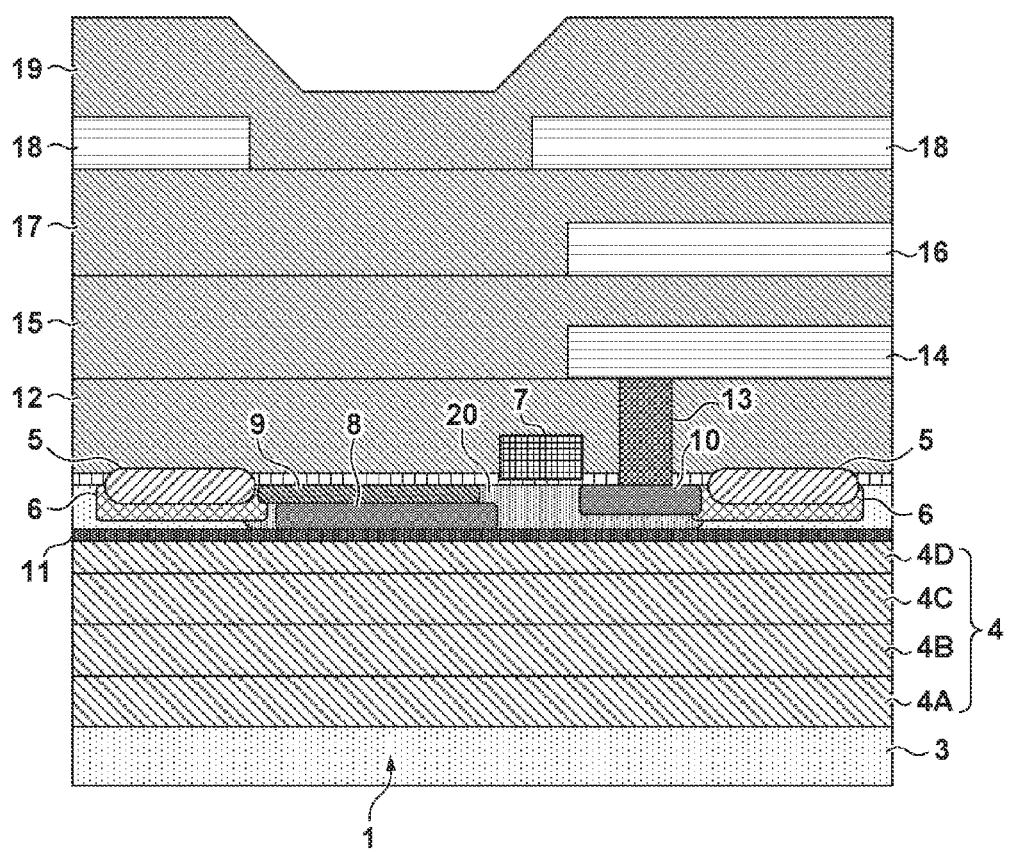
FIG. 5 is a view schematically showing the sectional structure of one pixel of a pixel array according to the third embodiment of the present invention.

FIG. 5 schematically shows the sectional structure of one pixel PIX of a pixel array GA according to the third embodiment of the present invention. The third embodiment is different from the second embodiment in that a stacked semiconductor region 4 includes a part arranged below an element isolation portion 5. The third embodiment is the same as the second embodiment in other aspects. In the third embodiment, it is possible to eliminate an influence of an alignment shift caused when forming a resist pattern for forming the stacked semiconductor region 4. It is also possible in the third embodiment to share a photomask for forming a fifth semiconductor region 11 and a photomask for forming the stacked semiconductor region 4.

Figure 6:
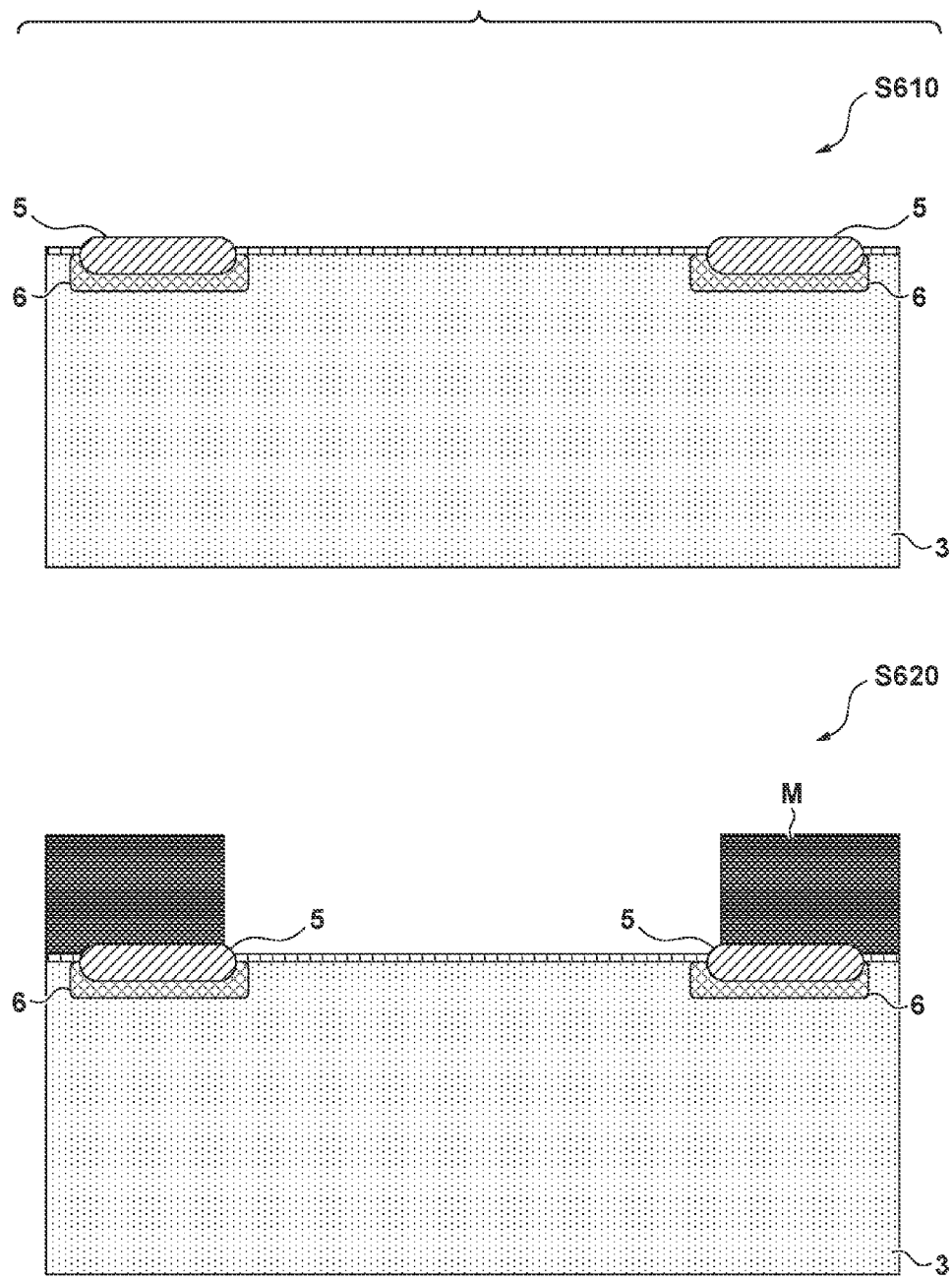
FIG. 6 is a view showing a method of manufacturing the solid-state image sensor according to the first to the third embodiments of the present invention.
Figure 7:
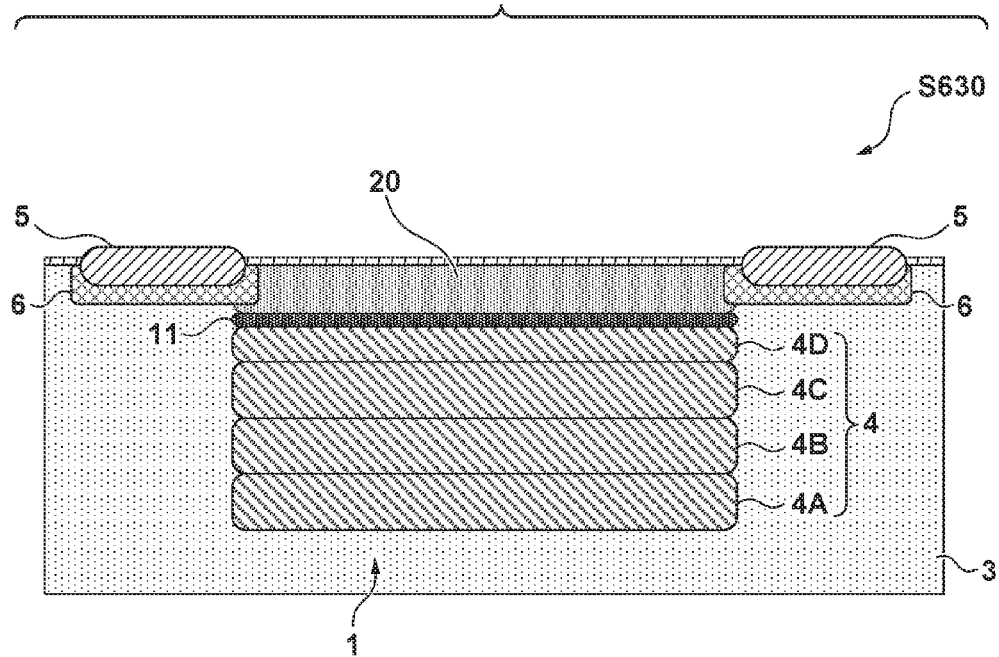
FIG. 7 is a view showing a method of manufacturing the solid-state image sensor according to the first to the third embodiments of the present invention.
Figure 7:
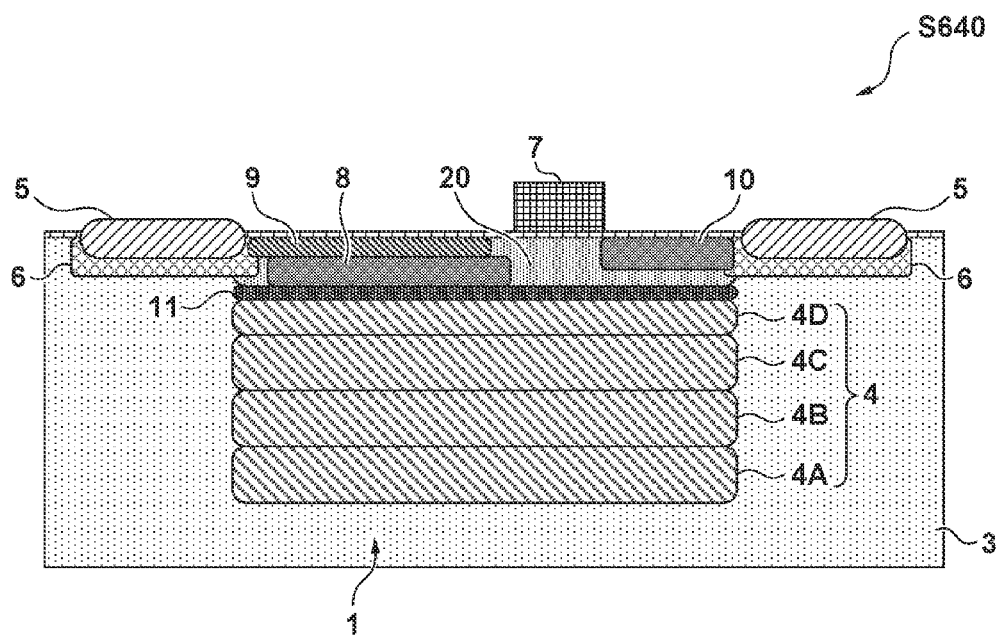

A method of manufacturing the solid-state image sensor 100 according to the first to the third embodiments of the present invention will be described below with reference to FIGS. 6 and 7.

First, in step S610, the element isolation portion 5 and the channel stopper 6 are formed in the semiconductor substrate 3. The element isolation portion 5 can be, for example, LOCOS or STI. Next, in step S620, a mask M is formed on the semiconductor substrate 3 by a photolithography process. This mask M is applicable to each of the first to the third embodiments.

Then, in step S630, ions are implanted into the semiconductor substrate 3 through the opening of the mask M, thereby forming the stacked semiconductor region 4 of the second conductivity type, the fifth semiconductor region 11 of the second conductivity type, and the fourth semiconductor region 20 of the second conductivity type. Then, in step S640, the gate electrode including the transfer gate 7, the charge accumulation region 8, the surface region 9, the FD 10, and the like are formed. After that, an interlayer insulation film, a contact plug, a via plug, a wiring layer, a color filter, a microlens, and the like are formed.

As an application of the solid-state image sensor according to the above-described embodiments, a camera in which the solid-state image sensor is assembled will exemplarily be described below. The concept of the camera includes not only an apparatus mainly aiming at shooting but also an apparatus (for example, a personal computer or a portable terminal) accessorily having a shooting function. The camera includes the solid-state image sensor according to the present invention exemplified as the above-described embodiments, and a processor which processes (for example, compression, color processing, or the like) a signal output from the solid-state image sensor. The processor can be formed by, for example, a PLD (an abbreviation for Programmable Logic Device) such as an FPGA (an abbreviation for Field Programmable Gate Array), an ASIC (an abbreviation for Application Specific Integrated Circuit), a computer in which a program is installed, or a combination of all or some of them.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-021489, filed Feb. 5, 2015, which is hereby incorporated by reference herein in its entirety.

What is claimed is:
1. A solid-state image sensor comprising:
a charge accumulation region of a first conductivity type;
a floating diffusion of the first conductivity type;
a stacked semiconductor region which includes a first semiconductor region of a second conductivity type different from the first conductivity type arranged below the charge accumulation region, a second semiconductor region of the second conductivity type arranged above the first semiconductor region, and a third semiconductor region of the second conductivity type arranged above the second semiconductor region;
a fourth semiconductor region of the second conductivity type arranged in a region between the charge accumulation region and the floating diffusion, below the floating diffusion, and above the stacked semiconductor region;
a transfer gate configured to form a channel, in the fourth semiconductor region, for transferring charges of the charge accumulation region to the floating diffusion; and
a fifth semiconductor region of the second conductivity type arranged in a region below the charge accumulation region and the fourth semiconductor region, and above the stacked semiconductor region, wherein with C1 being a peak value of an impurity concentration of the second conductivity type in the first semiconductor region, C2 being a peak value of an impurity concentration of the second conductivity type in the second semiconductor region, C3 being a peak value of an impurity concentration of the second conductivity type in the third semiconductor region, and C5 being a peak value of an impurity concentration of the second conductivity type in the fifth semiconductor region, C2<C3<C1 and C5<C3 are satisfied.

2. The sensor according to claim 1, wherein with C4 being a peak value of an impurity concentration of the second conductivity type in the fourth semiconductor region,

C5≥C4 is further satisfied.

3. The sensor according to claim 2, wherein C3>C4 is further satisfied.

4. The sensor according to claim 2, wherein C4<C1 is further satisfied.

5. The sensor according to claim 2, wherein C3>C4, C4<C1, 3×C2≤C1, and C3/4≤C5 are further satisfied.

6. The sensor according to claim 1, wherein 3×C2≤C1 is further satisfied.

7. The sensor according to claim 1, wherein 5×C2≤C1 is further satisfied.

8. The sensor according to claim 1, wherein C3/4≤C5 is further satisfied.

9. The sensor according to claim 1, further comprising an element isolation portion arranged adjacent to the floating diffusion, wherein the fifth semiconductor region includes a part arranged below the element isolation portion.

10. The sensor according to claim 9, wherein the stacked semiconductor region includes the part arranged below the element isolation portion.

11. The sensor according to claim 1, further comprising a semiconductor region of the second conductivity type arranged above the charge accumulation region.

12. The sensor according to claim 1 wherein $1\times10^{16}$ cm$^{-3}$≤C1≤$1\times10^{18}$ cm$^{-3}$, $1\times10^{15}$ cm$^{-3}$≤C2≤$5\times10^{16}$ cm$^{-3}$, $2\times10^{15}$ cm$^{-3}$≤C3≤$2\times10^{17}$ cm$^{-3}$, and $5\times10^{14}$ cm$^{-3}$≤C5≤$2\times10^{17}$ cm$^{-3}$ are further satisfied.

13. A camera comprising:

a solid-state image sensor; and a processor configured to process a signal output from the solid-state image sensor, wherein the solid-state image sensor comprises:

a charge accumulation region of a first conductivity type;

a floating diffusion of the first conductivity type;

a stacked semiconductor region which includes a first semiconductor region of a second conductivity type different from the first conductivity type arranged below the charge accumulation region, a second semiconductor region of the second conductivity type arranged above the first semiconductor region, and a third semiconductor region of the second conductivity type arranged above the second semiconductor region;

a fourth semiconductor region of the second conductivity type arranged in a region between the charge accumulation region and the floating diffusion, below the floating diffusion, and above the stacked semiconductor region;

a transfer gate configured to form a channel, in the fourth semiconductor region, for transferring charges of the charge accumulation region to the floating diffusion in the fourth semiconductor region; and a fifth semiconductor region of the second conductivity type arranged in a region below the charge accumulation region and the fourth semiconductor region, and above the stacked semiconductor region, wherein with C1 being a peak value of an impurity concentration of the second conductivity type in the first semiconductor region, C2 being a peak value of an impurity concentration of the second conductivity type in the second semiconductor region, C3 being a peak value of an impurity concentration of the second conductivity type in the third semiconductor region, and C5 being a peak value of an impurity concentration of the second conductivity type in the fifth semiconductor region, C2<C3<C1 and C5<C3 are satisfied.

* * * * *